(12) United States Patent
Kelekar

(10) Patent No.: US 8,783,273 B2
(45) Date of Patent: Jul. 22, 2014

(54) NO-CONTACT WET PROCESSING TOOL WITH SITE ISOLATION

(75) Inventor: Rajesh Kelekar, Los Altos, CA (US)

(73) Assignee: Intermolecular, Inc., San Jose, CA (US)

( * ) Notice: Subject to any disclaimer, the term of this patent is extended or adjusted under 35 U.S.C. 154(b) by 589 days.

(21) Appl. No.: 13/081,914

(22) Filed: Apr. 7, 2011

(65) Prior Publication Data

US 2012/0255583 A1     Oct. 11, 2012

(51) Int. Cl.
 *B08B 3/00*          (2006.01)
(52) U.S. Cl.
 USPC .......................................................... 134/184
(58) Field of Classification Search
 None
 See application file for complete search history.

(56) References Cited

U.S. PATENT DOCUMENTS

| 2003/0054110 A1* | 3/2003 | Yamaguchi et al. ........... 427/420 |
| 2007/0108063 A1* | 5/2007 | Nakada et al. ................ 205/510 |
| 2008/0225248 A1  | 9/2008 | Poon et al. |
| 2012/0164841 A1  | 6/2012 | Kelekar |

* cited by examiner

*Primary Examiner* — Eric Golightly

(57) ABSTRACT

Embodiments of the current invention describe a substrate processing tool. The substrate processing tool includes a housing defining a chamber, a substrate support, a container, and an impelling mechanism. The substrate support is coupled to the housing and configured to support a substrate within the chamber. The container is coupled to the housing within the chamber and configured to hold a liquid. The container is below and spaced apart from the substrate. The impelling mechanism is coupled to the housing and configured to apply a force to the liquid within the container such that an impelled portion of the liquid contacts a lower surface of the substrate.

12 Claims, 9 Drawing Sheets

NO-CONTACT WET PROCESSING TOOL WITH SITE ISOLATION

FIELD OF THE INVENTION

The present invention relates to apparatus and method for performing wet processing on a substrate. More particularly, this invention relates to a wet processing tool having site isolation, which does not contact the surface of the substrate to be processed.

BACKGROUND OF THE INVENTION

Combinatorial processing enables rapid evaluation of semiconductor, solar, or energy processing operations. The systems supporting the combinatorial processing are flexible to accommodate the demands for running the different processes either in parallel, serial or some combination of the two.

Some exemplary processing operations include operations for adding (depositions) and removing layers (etch), defining features, preparing layers (e.g., cleans), doping, etc. Similar processing techniques apply to the manufacture of integrated circuit (IC) semiconductor devices, flat panel displays, optoelectronics devices, data storage devices, magneto electronic devices, magneto optic devices, packaged devices, and the like. As feature sizes continue to shrink, improvements, whether in materials, unit processes, or process sequences, are continually being sought for the deposition processes. However, semiconductor and solar companies conduct research and development (R&D) on full wafer processing through the use of split lots, as the conventional deposition systems are designed to support this processing scheme. This approach has resulted in ever escalating R&D costs and the inability to conduct extensive experimentation in a timely and cost effective manner. Combinatorial processing as applied to semiconductor, solar, or energy manufacturing operations enables multiple experiments to be performed at one time in a high throughput manner. Equipment for performing the combinatorial processing and characterization must support the efficiency offered through the combinatorial processing operations.

BRIEF DESCRIPTION OF THE DRAWINGS

Various embodiments of the invention are disclosed in the following detailed description and the accompanying drawings.

DETAILED DESCRIPTION

Figure 1:
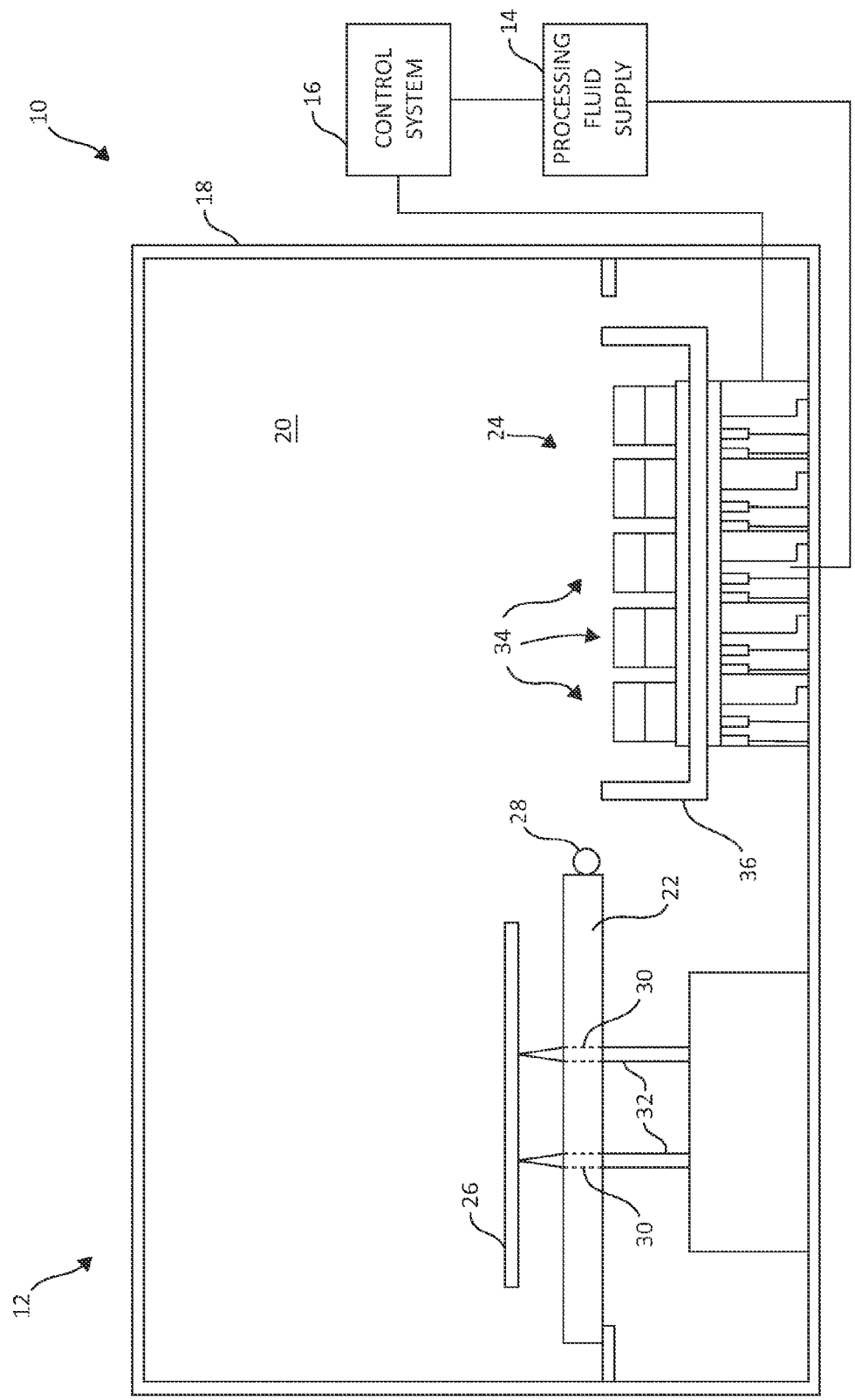
FIGS. 1 and 2 are simplified cross-sectional schematic views of a substrate processing tool, according to one embodiment of the present invention.

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The embodiments described below provide details for a multi-region processing system and associated processing heads that enable processing a substrate in a combinatorial fashion. Thus, different regions of the substrate may have different properties, which may be due to variations of the materials, unit processes (e.g., processing conditions or parameters) and process sequences, etc. Within each region the conditions are preferably substantially uniform so as to mimic conventional full wafer processing within each region, however, valid results can be obtained for certain experiments without this requirement. In one embodiment, the different regions are isolated so that there is no inter-diffusion between the different regions.

In addition, the combinatorial processing of the substrate may be combined with conventional processing techniques where substantially the entire substrate is uniformly processed (e.g., subjected to the same materials, unit processes and process sequences). Thus, the embodiments described herein can pull a substrate from a manufacturing process flow, perform combinatorial deposition processing and return the substrate to the manufacturing process flow for further processing. Alternatively, the substrate can be processed in an integrated tool that allows both combinatorial and conventional processing in a single chamber or various chambers attached around a central chamber. Consequently, in one substrate, information concerning the varied processes and the interaction of the varied processes with conventional processes can be evaluated. Accordingly, a multitude of data is available from a single substrate for a desired process.

The embodiments described herein enable the application of combinatorial techniques to process sequence integration in order to arrive at a globally optimal sequence of semiconductor manufacturing operations by considering interaction effects between the unit manufacturing operations, the process conditions used to effect such unit manufacturing operations, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed when fabricating a semiconductor device. A global optimum sequence order is therefore derived and as part of this derivation. The unit processes, unit process parameters, and materials used in the unit process operations of the optimum sequence order are also considered.

The embodiments described further below analyze a portion or sub-set of the overall process sequence used to manufacture a semiconductor device. Once the subset of the process sequence is identified for analysis, combinatorial process sequence integration testing is performed to optimize the materials, unit processes and process sequence used to build that portion of the device or structure. During the processing of some embodiments described herein, structures are formed on the processed semiconductor substrate equivalent to the structures formed during actual production of the semiconductor device. For example, such structures may include, but would not be limited to, trenches, vias, interconnect lines, capping layers, masking layers, diodes, memory elements, gate stacks, transistors, or any other series of layers or unit processes that create an intermediate structure found on semiconductor chips. While the combinatorial processing varies certain materials, unit processes, or process sequences, the composition or thickness of the layers or structures or the action of the unit process, such as cleaning, surface preparation, etch, deposition, planarization, implantation, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, or process sequences) and not the lack of process uniformity.

According to one aspect of the present invention, a substrate processing tool is provided, which allows wet processing to be performed on a substrate without contacting the substrate. The substrate processing tool includes a housing defining a chamber, a substrate support, a container, and an impelling mechanism. The substrate support is coupled to the housing and configured to support a substrate within the chamber. The container is coupled to the housing within the chamber and configured to hold a liquid. The container is below and spaced apart from the substrate. The impelling mechanism is coupled to the housing and configured to apply a force to the liquid within the container such that an impelled portion of the liquid contacts a lower surface of the substrate.

Figure 2:
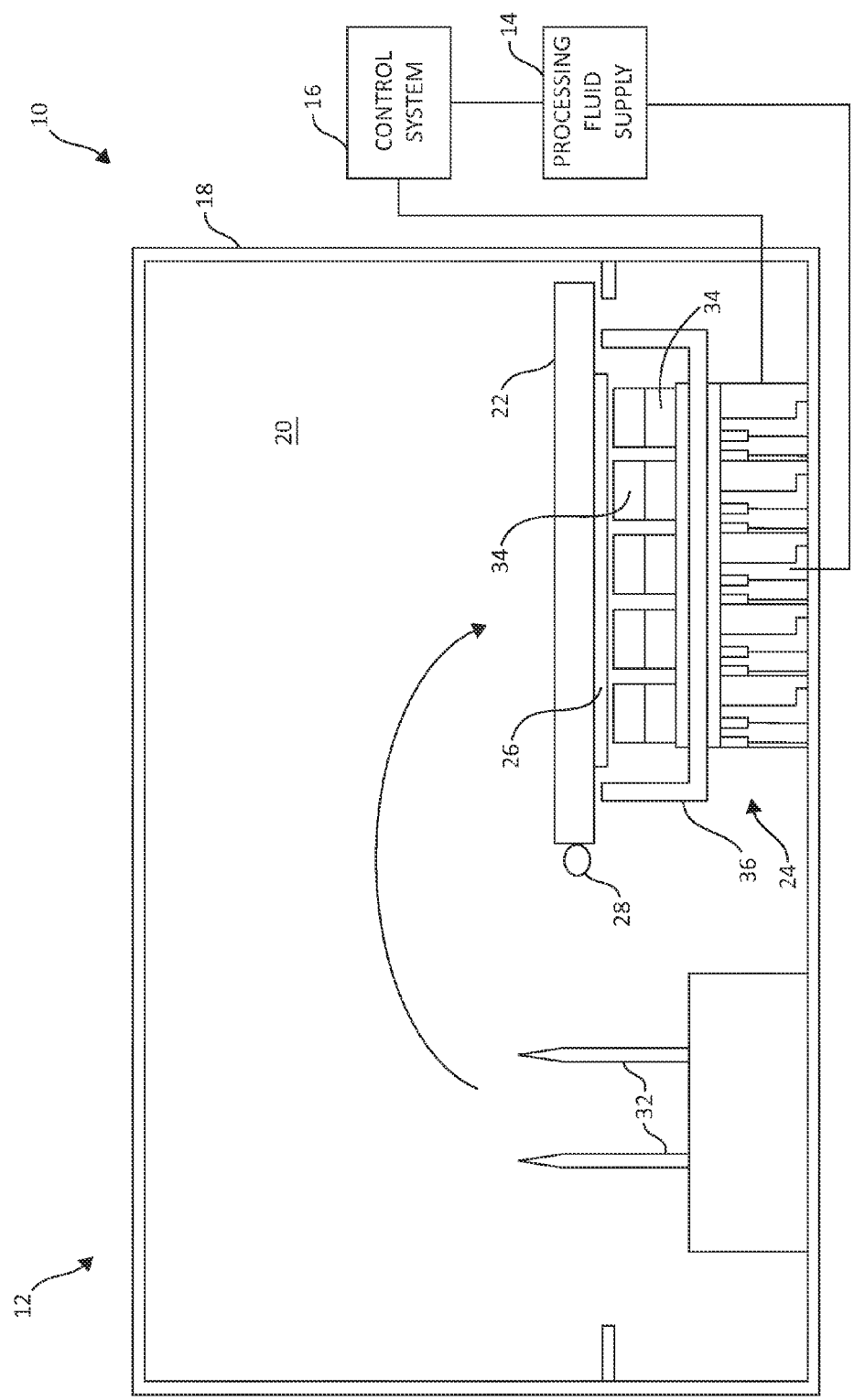

FIGS. 1 and 2 illustrate a substrate processing tool (or system) 10, according to one embodiment of the present invention. The substrate processing tool 10 is a "wet" processing tool, as is commonly understood, and includes a wet processing apparatus 12, a processing fluid supply system 14, and a control system 16.

Figure 3:
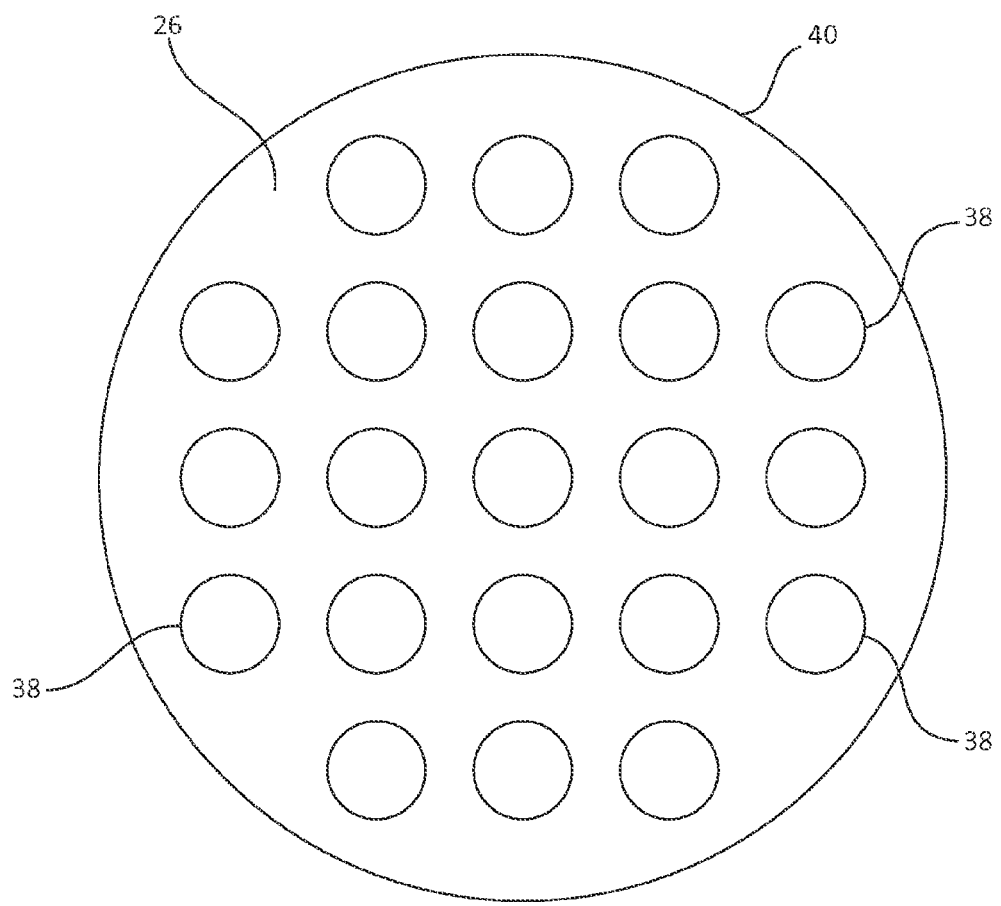
FIG. 3 is a plan view of a substrate indicating isolated regions thereon.

The wet processing apparatus 12 includes a housing 18 defining (and/or enclosing) a processing chamber 20, a substrate support 22, and a wet processing assembly 24. Referring now to FIGS. 1, 2, and 3, the substrate support 22 is positioned within the processing chamber 20 and is configured to hold a substrate 26. Although not shown in detail, the substrate support 22 may be configured to secure the substrate using, for example, a vacuum chuck, electrostatic chuck, or other known mechanism. The substrate support 26 is rotatably coupled to the housing 18 by a hinge actuator 28 such that the substrate support 26 is moveable between a loading position (shown in FIG. 1) and a processing position (shown in FIG. 2).

Referring to FIG. 1, the substrate support 22 includes a series of pin openings 30 extending therethrough which mate with substrate pins 32 (i.e., the substrate pins 32 extend through the pin openings 30), located within the processing chamber 20, when the substrate support 22 is in the loading position. As shown, when the substrate support 22 is in the loading position (e.g., after being loaded by a robot), the substrate 26 is supported by the substrate pins 32. When the substrate support 22 is rotated to the processing position (FIG. 2), the substrate support lifts the substrate 26 from the substrate pins 32 and positions the substrate 26 over the wet processing assembly 24, as described in greater detail below.

The substrate 26 may be a conventional, round substrate (or wafer) having a diameter of, for example, 200 millimeter (mm) or 300 mm. In other embodiments, the substrate 26 may have other shapes, such as a square or rectangular. It should be understood that the substrate 26 may be a blanket substrate (i.e., having a substantial uniform surface), a coupon (e.g., partial wafer), or even a patterned substrate having predefined regions (or locations) 30. The term region is used herein to refer to a localized area on a substrate which is, was, or is intended to be used for processing or formation of a selected material. The region may include one region and/or a series of regular or periodic regions pre-formed on the substrate. The region may have any convenient shape, e.g., circular, rectangular, elliptical, wedge-shaped, etc. In the semiconductor field a region may be, for example, a test structure, single die, multiple die, portion of a die, other defined portion of substrate, or a undefined area of a, e.g., blanket substrate which is defined through the processing.

Still referring to FIG. 1, the wet processing assembly 24 includes an array isolation processing units 34 and an interstitial processing unit (or container) 36. Although only five isolation processing units 34 are shown, it should be understood that the array may include considerably more, such as over twenty such units. As is described in greater detail below, each of the isolation processing units 34 is configured to perform wet processing on an isolated region on the substrate 26, while the interstitial processing unit may essentially be a larger container, in which the isolation processing units are placed, configured to perform wet processing on the remainder of the substrate 26. The wet processing assembly 24 is in fluid communication with the processing fluid supply 14 and operable communication with the control system 16.

Referring again to FIG. 2, when the substrate 26 is moved into the processing position, a lower surface (i.e., after being flipped by the hinge actuator 28) of the substrate is positioned adjacent to the isolation processing units 34 and the substrate is positioned within an upper region of the interstitial processing unit 36.

FIG. 3 illustrates the substrate 26 according to one embodiment of the present invention. The substrate 26 includes a series of regions 38 and an outer edge 40. As is evident in FIG. 3, the regions 38 have widths (or diameters) that are considerably smaller than a width (or diameter) of the substrate 26. Each of the regions 38 corresponds to (i.e., is processed by) one of the isolation processing units 34. The outer edge 40 of the substrate 26, in one embodiment, corresponds to (i.e., is substantially the same size and shape of) the interstitial processing unit 36. As such, the isolation processing units 34 and the interstitial processing unit 36 are, in one embodiment, substantially circular. The portion(s) of the substrate 26 outside of the regions may be referred to as an "interstitial" portion (or portions) or region.

Figure 4:
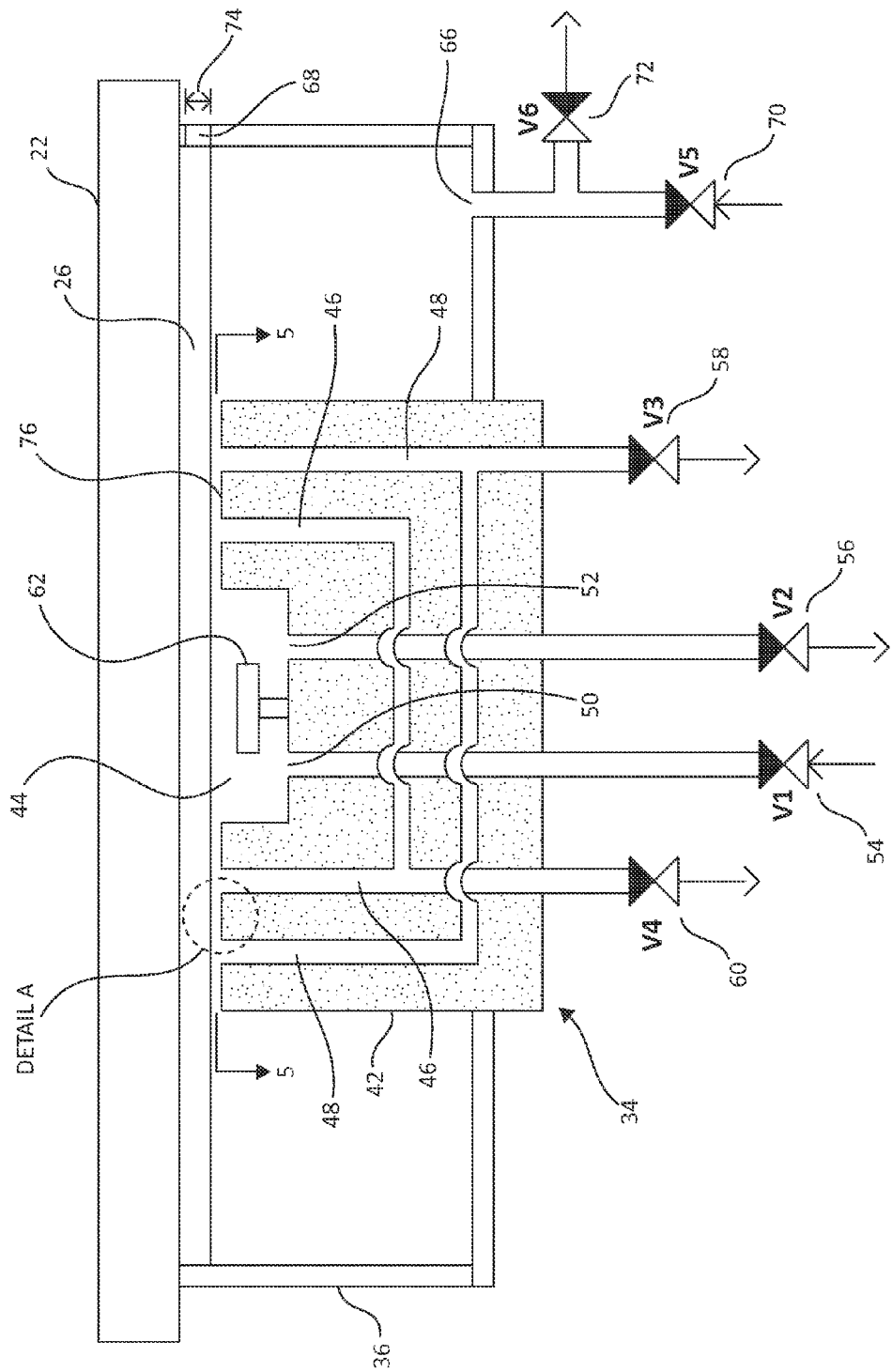
FIG. 4 is a simplified cross-sectional schematic view of a wet processing assembly within the tool of FIG. 1, according to one embodiment of the present invention.

FIG. 4 is a simplified schematic illustration of one of the isolation processing units 34 and the interstitial processing unit 36. It should be noted that only one isolation processing unit 34 is shown for sake of clarity. However, as described above, multiple isolation processing units 34 may be positioned within the interstitial processing unit 34 to simultaneously process multiple isolated regions 38 (FIG. 3).

Figure 5:
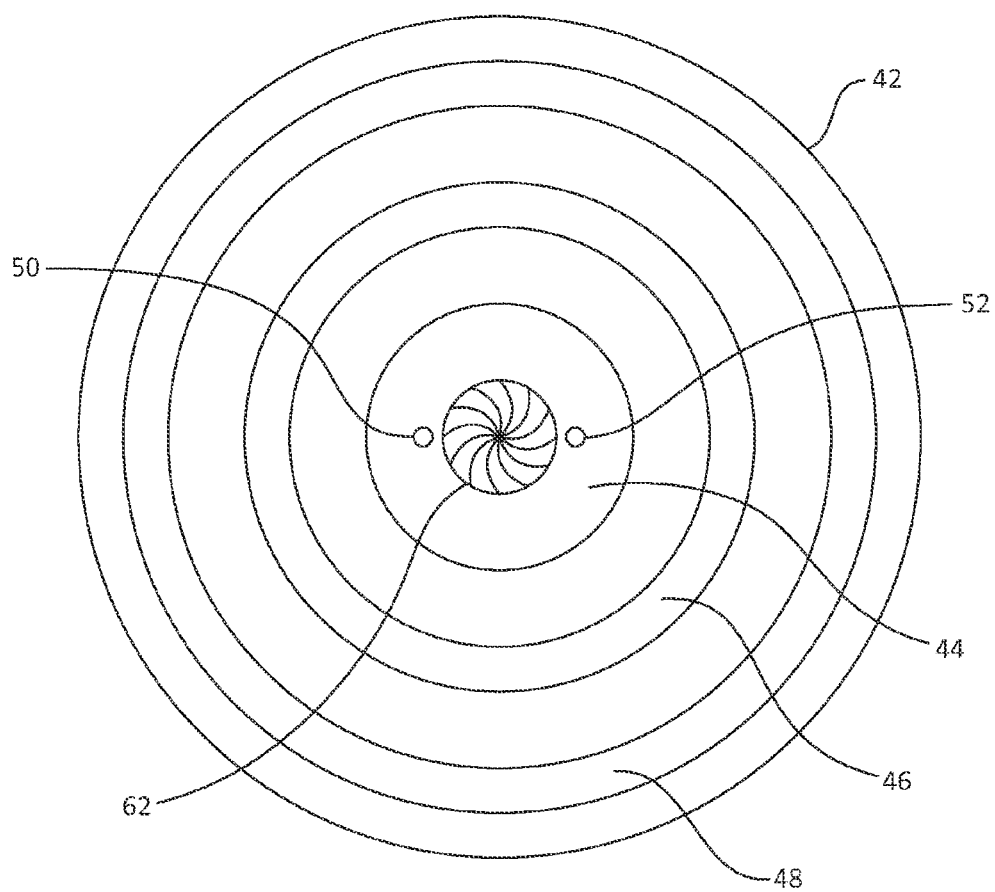
FIG. 5 is plan view of a liquid container within the wet processing assembly along line 5-5 in FIG. 4.

The isolation processing unit 34 is essentially made of an isolation container 42, which may be made of a chemically inert material, such as polytetrafluoroethylene (PTFE). Referring to FIG. 5 in combination with FIG. 4, the isolation container 42 includes, at an upper surface thereof, a central receptacle 44, a first (or inner) trench 46, and a second (or outer) trench 48, along with various fluid conduits extending therethrough. The central receptacle 44 is substantially circular and is positioned at a central portion of the isolation container 42. The central receptacle 44 includes an inlet port 50 and an outlet port 52, which are respectively in fluid communication with valves 54 (V1) and 56 (V2) (FIG. 4).

The first trench 46 has a substantially annular shape and circumscribes (or surrounds) the central receptacle 44. The second trench 48 also has a substantially annular shape and circumscribes the first trench 46. As shown in FIG. 4, the second trench 48 is isolated from (i.e., not in direct fluid communication with) the first trench 46, as the second trench 48 is in fluid communication with valve 58 (V3), and the first trench 46 is in fluid communication with valve 60 (V4).

In the embodiment shown in FIGS. 4 and 5, the isolation processing unit 34 also includes an impelling mechanism 62 positioned within the central receptacle 44 of the isolation container 42. In one embodiment, the impelling mechanism 62 is an impeller (or propeller) that is rotatably coupled to the isolation container 42 and/or the housing 18 of the substrate processing apparatus 12 (FIGS. 1 and 2). Although not shown, the impelling mechanism 62 may include an actuator (e.g., a motor) coupled to the housing 18.

In another embodiment, the impelling mechanism is a plunger positioned within the central receptacle and driven by, for example, a pneumatic cylinder that moves the cylinder upwards (i.e., in a linear manner), thus causing the liquid to be forced upwards onto the substrate 26. In such an embodiment, the plunger may appear similar to the impeller (or propeller) as it is shown in FIG. 4, but it may have a diameter (or width) that substantially extends the entire width of the central receptacle 44.

Figure 6:
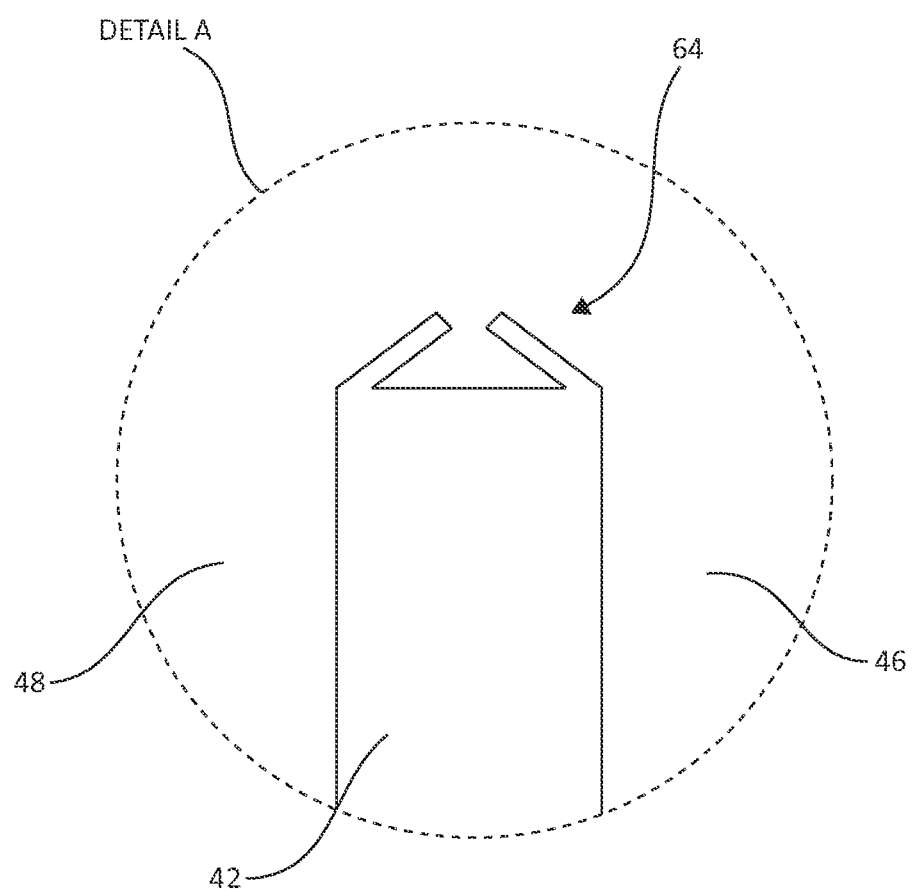
FIG. 6 is a cross-sectional side view of a portion of the liquid container on Detail A of FIG. 4.

FIG. 6 illustrates a region of the upper surface of the isolation container 42 between the first trench 46 and the second trench 48. As shown, an embankment structure 64 is formed on the upper surface between the first trench 46 and the second trench 48.

Referring again to FIG. 4, the interstitial processing unit 36 includes a fluid port 66 and a vent opening 68. The fluid port 66 is positioned on the lower wall of the interstitial processing unit 66 and is in fluid communication with valve 70 (V5) and valve 72 (V6). The vent opening 68 is located at an upper portion of the side wall of the interstitial processing unit 66 and extends a distance 74 from the substrate support 22 that is greater than the thickness of the substrate 26 (i.e., such that gases within the interstitial processing unit 66 may be vented).

Of particular interest in FIG. 4, is the spacing between the isolation container 42 and the substrate 22. In one embodiment, a gap 76 of approximately 0.125 mm separates the isolation container 42 and the substrate 22. More specifically, the isolation container 42 does not contact the lower surface of the substrate 22.

Referring again to FIGS. 1 and 2, the processing fluid supply system 14 includes one or more supplies of various processing fluids (and/or a vacuum supply), such as cleaning and etching solutions and processing gases, as well as temperature control units to regulate the temperatures of the various fluids. The fluid supply system 14 is in fluid communication with valves 54, 56, 58, 60, 70, and 72 (FIG. 4). The control system (or controller) 16 includes, for example, a processor and memory (i.e., a computing system) in operable communication with the processing fluid supply system 14, the wet processing units 34, and valves 54, 56, 58, 60, 70, and 72. The control system is configured to control the operation of the wet processing apparatus 12 (FIG. 1) as described below.

In operation, after the substrate is transferred into the chamber 20 and flipped over the wet processing assembly 24, the control system 16, via the processing fluid supply 14, deliveries various processing liquids and gases to the isolation processing units 34 and/or the interstitial processing unit 36. Examples of wet processes that may be performed on the substrate 26 include wet cleanings, wet etches and/or strips, and electroless depositions.

Referring again to FIG. 4, the operation of the wet processing apparatus 12 (FIG. 1) will now be described with respect to one of the wet processing units 34 and the interstitial processing unit 36. However, it should be understood that all of the isolation processing units 34 may be similarly operated at the same time (e.g., the impelling mechanisms 62 of multiple isolation processing units 34 may be operated at the same time).

First, a processing liquid is delivered through valve 54 and the inlet port 50 of the central receptacle 44 of the isolation container 42. It should be noted that, initially, valve 54 may be opened while valves 56 and 60 are closed. Additionally, during delivery of the processing liquid through valve 54, valve 58 may be opened and in fluid communication with a vacuum supply in the processing fluid supply 14 in order to collect liquid overflowing from the central receptacle 44. When delivery of the liquid stops, valve 58 may be closed. The initial volume of the liquid delivered may be sufficient to submerge the impeller 62. After the impeller 62 is submerged, the impeller 62 is activated.

In the embodiment shown in FIGS. 4 and 5, the impeller 62 is rotated, causing an upwards force to be applied to the liquid. This force is sufficient to lift at least some of the liquid (i.e., an impelled portion) onto the lower surface of the substrate 26. Due to the wetting properties of the substrate 26, some of the impelled portion of the liquid remains on the lower surface of the substrate 26.

After being operated for a brief period of time (e.g., a few seconds), the impeller 62 may be deactivated. After the deactivation of the impeller 62, the delivery of the liquid to the central receptacle 44 may continue (after being optionally paused during the operation of the impeller 62). As the volume of the liquid increases, eventually the liquid will fill the central receptacle 44 of the isolation container 42 and merge with the impelled liquid on the lower surface of the substrate 26.

As the volume of the delivered liquid continues to increase, the liquid may overflow from the central receptacle 44 and spread radially between the upper surface of the isolation container 42 and the lower surface of the substrate 26 into the first trench 46 (see FIG. 5). Because valve 60 is closed, the liquid fills the first trench 46, and overflow liquid may again be removed through the second trench 48 and valve 58 via a vacuum supply. After the first trench 46 is filled, valve 54 is closed, thus ceasing the delivery of the liquid to the central receptacle 44 of the isolation container 42.

With the central receptacle 44, the first trench, and the gap 76 between the isolation container 42 filled with liquid, a stationary body of liquid is provided, which is in contact with the portion of the lower surface of the substrate 26 between opposing sides of the first trench 46 of the isolation container 42 (i.e., which corresponds to one of the regions 38 shown in FIG. 3). The stationary nature of the body of liquid may be assisted by the embankment formation 64 (FIG. 6) on the upper surface of the isolation container 42. Depending on the liquid used, this stationary body of liquid may, for example, perform a cleaning or etching process on the particular region 38 of the substrate 26.

Of particular interest is that this stationary body of liquid is formed without the isolation container 42 contacting the lower surface of the substrate 26, while being below the substrate 26. Thus, the likelihood of any contaminants being left on the substrate 26 from the isolation container 42 is reduced. Additionally, the stationary body of liquid in contact with one region 38 (FIG. 3) of the substrate is isolated from the bodies of liquid in contact with the other regions 38 of the substrate.

After a period of time (e.g., 1-3 minutes) suitable for the particular process (or reaction), valves 56 and 60 are opened, thus allowing the liquid to be drained from the isolation container 42. The draining may be facilitated by valves 56, 58, and 60 being in fluid communication with a vacuum supply.

Still referring to FIG. 4, to process the interstitial portion of the substrate 26, valves 70 and 60 may be initially opened while valves 58 and 72 are closed. Processing liquid is delivered into the interstitial processing unit 36 through valve 70 and the fluid port 66. The level of the liquid rises until it flows over the upper surface of the isolation container 42 and into the second trench 48. After the second trench 48 is filled, the liquid flows over the embankment structure 64 (FIG. 6) and into the first trench 46, where it may be removed through valve 60 via a vacuum supply.

After the liquid begins to flow into the first trench 46, valves 60 and 70 are closed, at which point a stationary body of liquid is in contact with the interstitial portion(s) of the lower surface of the substrate 26. Thus, as with the regions 38 (FIG. 3), the interstitial portion of the substrate 26 may undergo a wet process without the interstitial processing unit 36 contacting the lower surface of the substrate 26. Additionally, the stationary body of liquid in contact with the interstitial portion of the substrate 26 is isolated from the regions 38 of the substrate (FIG. 3).

After an appropriate amount of time, depending on the process being performed, valves 58, 60, and 72 are opened to drain the liquid. The draining of the liquid may be facilitated by vacuum supplies within the processing fluid supply system 14 (FIG. 1).

It should be noted that the portion of the lower surface of the substrate 26 which is adjacent to the embankment structure 64 (FIG. 6) may be exposed to the liquid(s) during both phases of processing. That is, this region may be processed during both the processing of the region(s) 38 and the interstitial portion(s) of the substrate 26.

Figure 7:
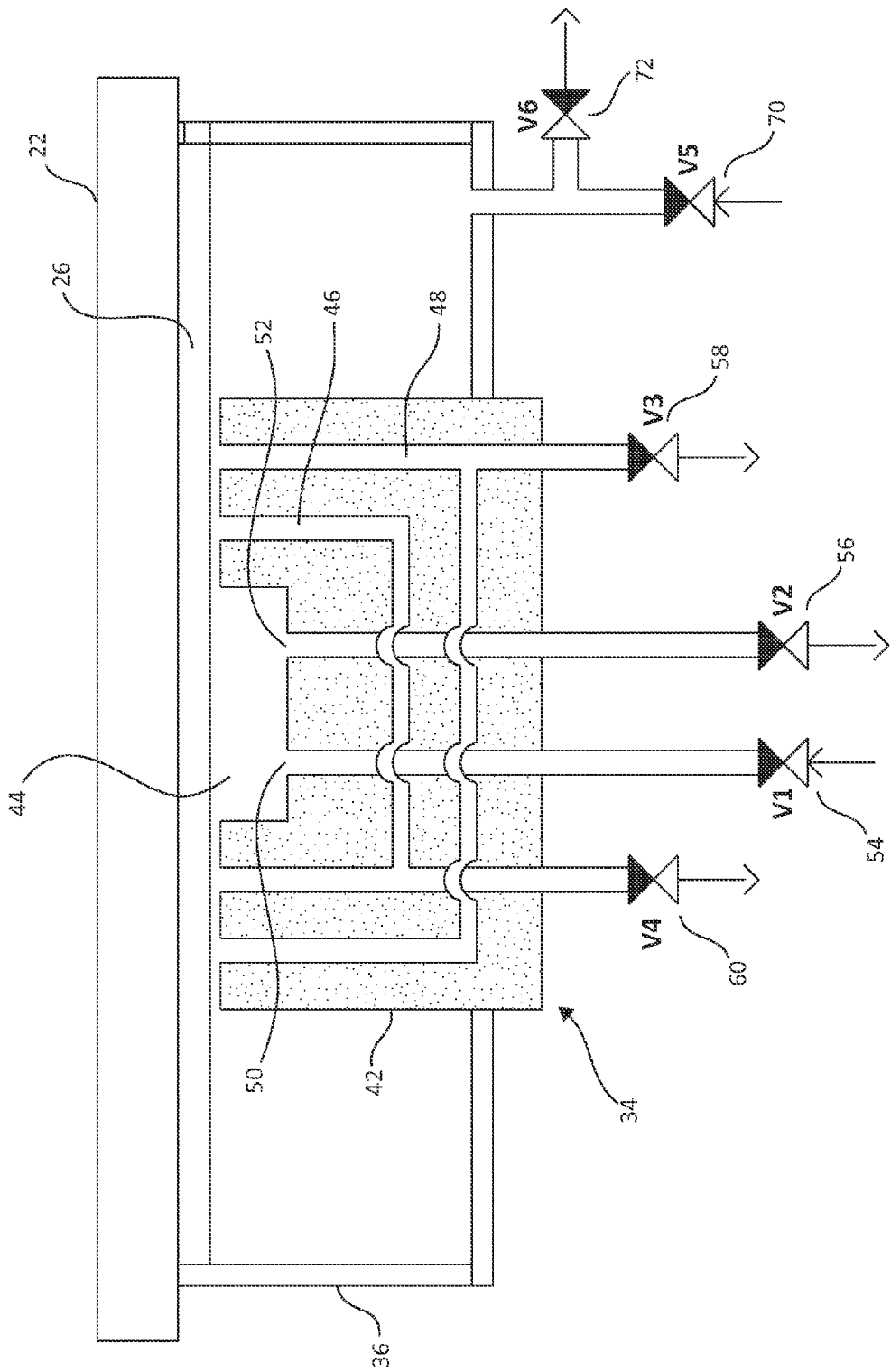
FIGS. 7, 8, and 9 are simplified cross-sectional schematic views of wet processing assemblies, according to other embodiments of the present invention.

FIG. 7 illustrates a wet processing unit 34, according to another embodiment of the present invention. As shown, the wet processing unit 34 is similar to that shown in FIG. 4. However, of particular interest, is the lack of an impeller within the central receptacle 44 of the isolation container 42. In this embodiment, the impelling mechanism includes the outlet port 52 (and/or valve 56 and/or a gas supply within the processing fluid supply system 14). In the embodiment shown in FIG. 7, after the liquid delivered to the central receptacle 44 rises to a predetermined level, a gas is delivered into the central receptacle 44 through the outlet port 52. As the gas rises through the liquid, bubbles are formed in the liquid that push a portion (i.e., the impelled portion) of the liquid upwards onto the lower surface of the substrate 26. After the substrate 26 is appropriately wetted, the processing may proceed in a similar manner to that described above.

It should also be noted that the embodiment shown in FIG. 7 may utilize the second trench 48 (and/or valve 58 and/or a gas supply within the processing fluid supply system 14) as the impelling mechanism. In one embodiment, while the liquid is being delivered to the central receptacle 44 of the isolation container 42, a gas is delivered into the second trench 48 through valve 58. The shape of the second trench 48 (i.e., annular) causes the injected gas to form a "gas ring" around the first trench 46 and the central receptacle 44 such that the liquid is prevented from draining into the second trench 48, and thus continues to rise until contact is made with the substrate 26.

Figure 8:
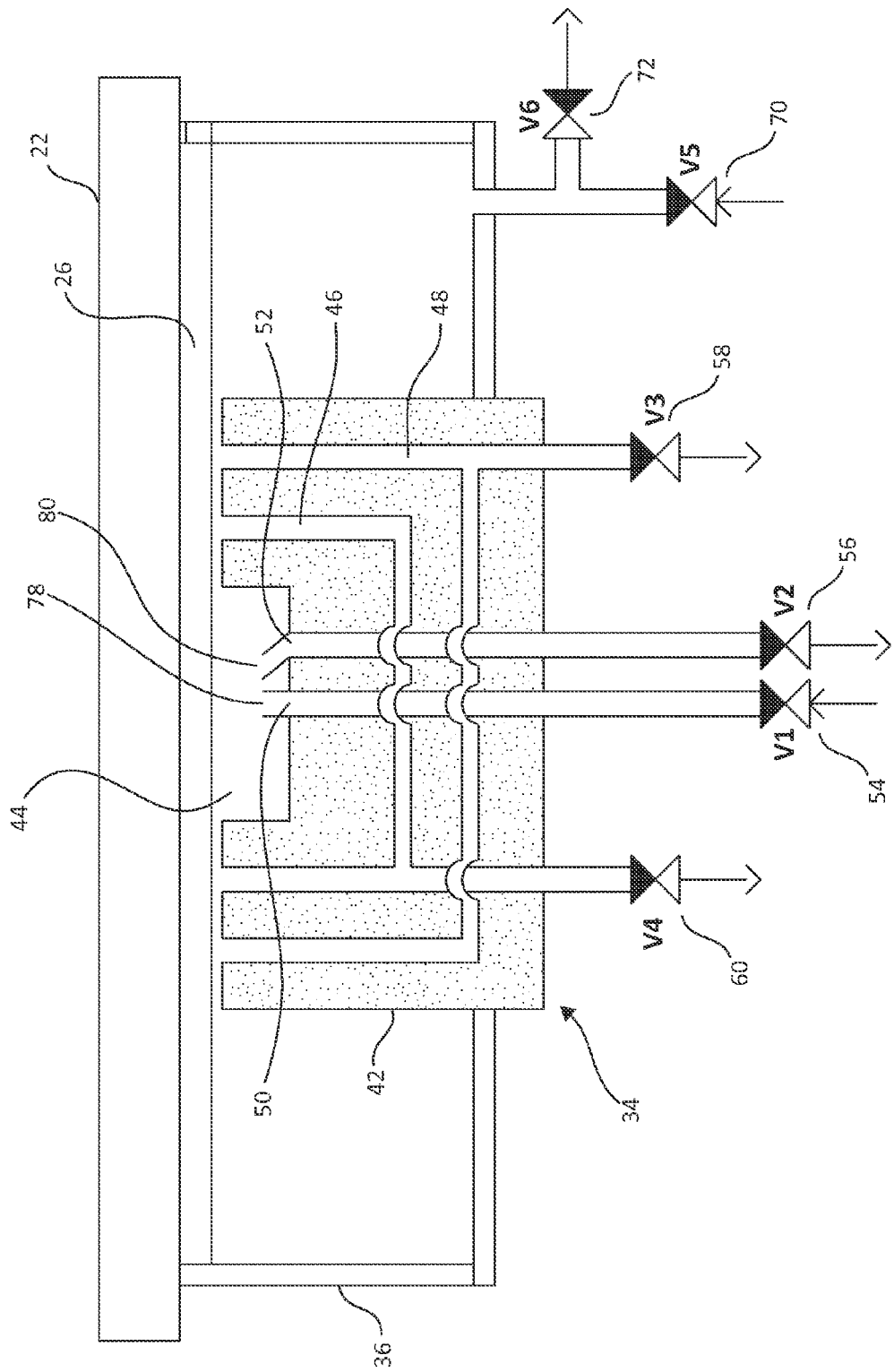

FIG. 8 illustrates a wet processing unit 34, according to another embodiment of the present invention. In the embodiment shown in FIG. 8, the impelling mechanism utilized includes the inlet port 50 and the outlet port 52 within the central receptacle 44 (and/or valves 54 and 56 and/or a gas supply within the processing fluid supply system 14). As shown, nozzles 78 and 80 are respectively connected to the inlet port 50 and the outlet port 52. The nozzles 78 and 80 extend into the central receptacle 44 and are arranged such that nozzle 80 is directed towards nozzle 78. As the liquid is delivered into the central receptacle 44 through the inlet port 50 and nozzle 78, gas is directed (at relatively high speeds) into the liquid through outlet port 52 and nozzle 80, causing it to be propelled upwards (e.g., in atomized form) onto the lower surface of the substrate 26.

Figure 9:
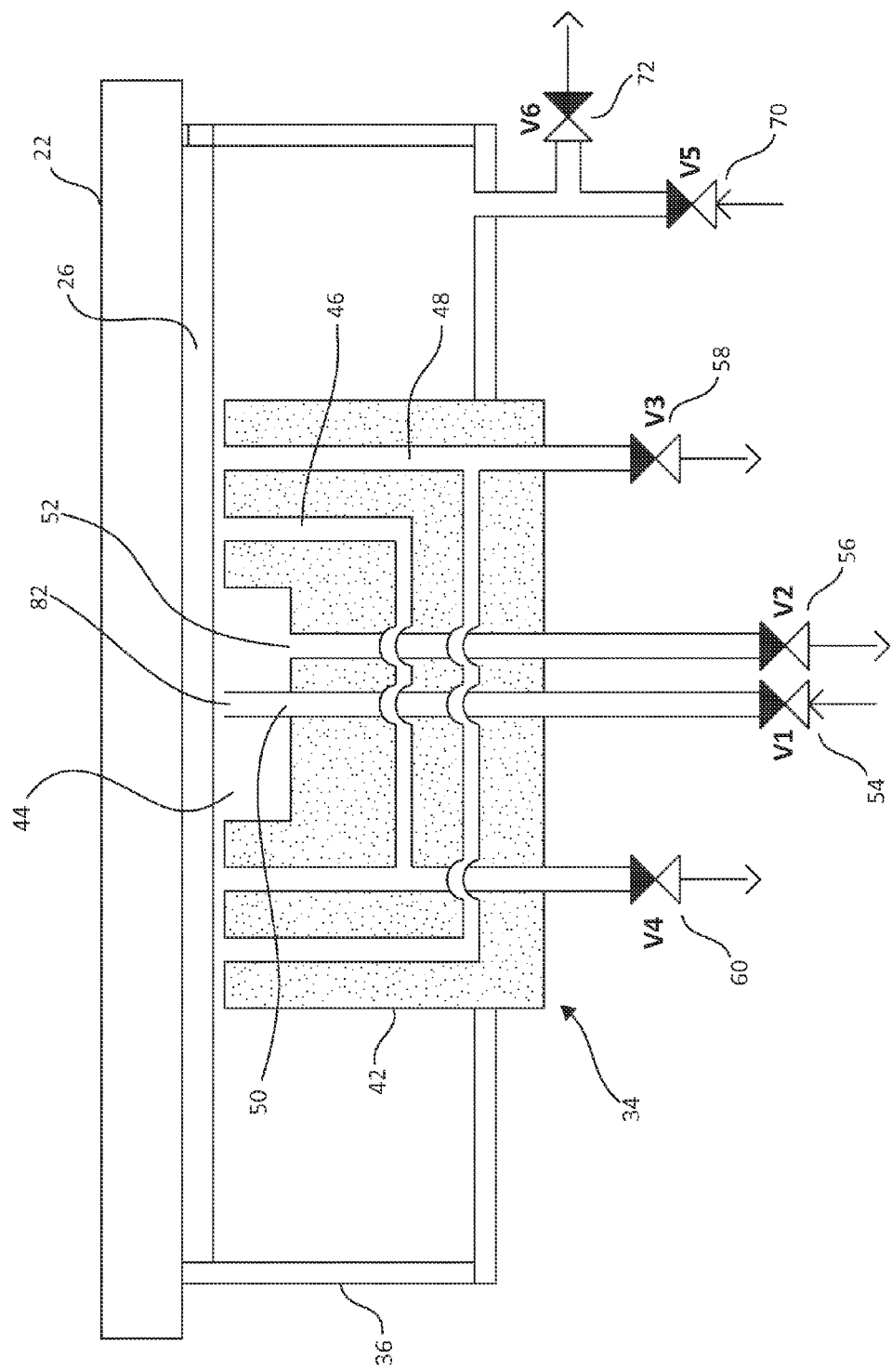

FIG. 9 illustrates a wet processing unit 34, according to a further embodiment of the present invention. In the embodiment shown in FIG. 9, the impelling mechanism utilized includes a sleeve 82 extending from the inlet port 50 within the central receptacle 44 (and/or valves 54 and/or a gas supply within the processing fluid supply system 14). As shown, the sleeve 82 extends upwards into the central receptacle 44 such that an end thereof is in close proximity with (e.g., within 0.125 mm, but not in contact with) the lower surface of the substrate 26. As the liquid is delivered into the central receptacle 44 through the inlet port 50 and the sleeve 82, the proximity of the end of the sleeve 82 and/or the pressure with which the liquid is delivered, causes the liquid to be propelled upwards onto the lower surface of the substrate 26 adjacent to the end of the sleeve 82. As the level of the liquid rises to near the top of the central receptacle 44, the presence of the impelled liquid on the substrate 26 facilitates the liquid in coating the respective region 38 (FIG. 3).

It should also be noted that because of the site isolation provided by the system described above, separate and unique wet processes may be performed simultaneously on the different regions 38 and/or the interstitial portion (FIG. 3) of the substrate 26. As such, the substrate processing tool 10 may be provided with a variation generating system (or subsystem) configured to intentionally vary (or create differences between) the wet processes performed on two or more of the regions 38 and/or the interstitial portion of the substrate 26. The variation generating system may include, for example, the processing fluid supply system 14 and/or the control system 16.

One possible variation generated between two or more of the processes is the chemical composition, pH level, and/or temperatures of the processing fluids, as well as any processing gases dissolved therein, provided to the isolation containers 42 (and/or the interstitial processing unit 36) by the processing fluid supply system 14.

One possible type of processing fluid that may be used is cleaning liquids. An example of a cleaning liquid is a mixture of ammonium hydroxide ($NH_4OH$), hydrogen peroxide ($H_2O_2$), and deionized (DI) water ($H_2O$). A typical concentration ratio for the mix is 1:1:5 $NH_4OH:H_2O_2:H_2O$. However, as described herein, this ratio may be varied among the different liquid containers 44. Such a mixture may perform well at removing particles, as well as organic and metallic contaminants, from the surface of the substrate 26. Another example of a cleaning liquid is a mixture of hydrochloric acid (HCl), hydrogen peroxide ($H_2O_2$), and deionized (DI) water ($H_2O$). A typical concentration ratio for the mix is 1:1:5 HCl:H2O2:H2O. Again, however, this ratio may be varied among the different liquid containers 44 is accordance with one aspect of the present invention. Such a mixture may be used for removing metal contaminants from the surface of the substrate 26.

It should be understood that the surface of the substrate 26 being processed may take the form of any semiconductor process surface, either at the front end of the line (FEOL) or the back end of the line (BEOL), as is commonly understood. Examples include BEOL low-k dielectrics on logic dies, any surface after a chemical-mechanical polishing (CMP), and high-k dielectrics on memory dies. Examples of cleanings include FEOL pre-gate cleanings and BEOL post-copper etch cleanings. It should also be understood that the size, shape, and number of the isolation containers 42 and/or the corresponding regions 38 on the substrate 26 may be different in other embodiments.

In one embodiment, a substrate processing tool is provided. The substrate processing tool includes a housing defining a chamber, a substrate support, a container, and an impelling mechanism. The substrate support is coupled to the housing and configured to support a substrate within the chamber. The container is coupled to the housing within the chamber and configured to hold a liquid. The container is below and spaced apart from the substrate. The impelling mechanism is coupled to the housing and configured to apply a force to the liquid within the container such that an impelled portion of the liquid contacts a lower surface of the substrate.

In another embodiment, a method for processing a substrate is provided. A container is positioned below and spaced apart from a substrate. A volume of a liquid is delivered to the container. A force is applied to the liquid such that an impelled portion of the liquid contacts a lower surface of the substrate.

In a further embodiment, a substrate processing tool is provided. The substrate processing tool includes a housing defining a chamber, a substrate support, an isolation container, and an impeller. The substrate support is coupled to the housing and configured to support a substrate within the chamber. The isolation container is coupled to the housing within the chamber and configured to hold a liquid. The isolation container is below and spaced apart from the substrate and has a width that is less than a width of the substrate. The impeller is rotatably coupled to the housing and positioned within the isolation container. Rotation of the impeller causes a force to be applied to the liquid in the isolation container such that an impelled portion of the liquid contacts a lower surface of the substrate.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A substrate processing tool comprising:
a housing defining a chamber;
a substrate support coupled to the housing and configured to support a substrate within the chamber;
a first container coupled to the housing within the chamber and configured to hold a first liquid, the first container being below and spaced apart from a lower surface of the substrate;
a first impelling mechanism coupled to the housing and configured to apply a force to the first liquid within the first container such that an impelled portion of the first liquid contacts a first portion of the lower surface of the substrate;
a second container coupled to the housing within the chamber and configured to hold a second liquid, the second container being below and spaced apart from the lower surface of the substrate;
a second impelling mechanism coupled to the housing and configured to apply a second force to the second liquid within the second container such that an impelled portion of the second liquid contacts a second portion of the lower surface of the substrate, wherein the first liquid is isolated from the second liquid and a width of the first portion of the lower surface of the substrate and a width of the second portion of the lower surface of the substrate are less than a width of the lower surface of the substrate; and
a third container coupled to the housing within the chamber, spaced apart from the substrate, and positioned substantially below the lower surface of the substrate, wherein the first container and the second container are positioned within the third container such that liquid held by the third container contacts an interstitial portion of the lower surface of the substrate between the first and second portions of the lower surface of the substrate.

2. The substrate processing tool of claim 1, wherein the first container comprises a central receptacle and a trench surrounding the central receptacle.

3. The substrate processing tool of claim 2, further comprising:
a liquid supply in fluid communication with the central receptacle of the first container and configured to deliver the first liquid thereto; and
a controller in operable communication with the liquid supply and the first impelling mechanism.

4. The substrate processing tool of claim 3, wherein the first impelling mechanism comprises an impeller rotatably coupled to the housing and positioned within the first container, wherein rotation of the first impeller causes the force to be applied to the first liquid in the central receptacle.

5. The substrate processing tool of claim 3, wherein the first impelling mechanism comprises a gas supply in fluid communication with the first container, the first container and the gas supply being configured such that delivery of gas from the gas supply to the central receptacle causes the force to be applied to the first liquid in the container.

6. The substrate processing tool of claim 5, wherein the first container further comprises a second trench surrounding the trench and the gas supply is in fluid communication with the second trench such that delivery of gas from the gas supply causes the force applied to the first liquid in the first container to prevent the first liquid from flowing into the second trench.

7. The substrate processing tool of claim 5, wherein the first container further comprises a nozzle in fluid communication with the gas supply, the nozzle being configured such that delivery of gas from the gas supply to the central receptacle through the nozzle causes the force to be applied to the first liquid in the container.

8. The substrate processing tool of claim 3, wherein the first impelling mechanism comprises a plunger moveably coupled to the housing and positioned within the first container, wherein linear movement of the plunger causes the force to be applied to the first liquid in the central receptacle.

9. The substrate processing tool of claim 3, wherein the first impelling mechanism comprises a sleeve extending into the central receptacle and in fluid communication with the liquid supply such that when the first liquid is delivered to the first container from the liquid supply, the first liquid is propelled onto the lower surface of the substrate.

10. A substrate processing tool comprising:
a housing defining a chamber;
a substrate support coupled to the housing and configured to support a substrate within the chamber;
a first isolation container coupled to the housing within the chamber and configured to hold a first liquid, the first isolation container being below and spaced apart from the substrate and having a width that is less than a width of the substrate;
a first impeller rotatably coupled to the housing and positioned within the first isolation container, wherein rotation of the first impeller causes a force to be applied to the first liquid in the first isolation container such that an impelled portion of the first liquid contacts a first portion of the lower surface of the substrate;
a second isolation container coupled to the housing within the chamber and configured to hold a second liquid, the second isolation container being below and spaced apart from the substrate and having a width that is less than the width of the substrate;
a second impeller rotatably coupled to the housing and positioned within the second isolation container, wherein rotation of the second impeller causes a force to be applied to the second liquid in the second isolation container such that an impelled portion of the second liquid contacts a second portion of the lower surface of the substrate, wherein the liquid in the first isolation container is isolated from the second liquid in the second isolation container; and
an interstitial container coupled to the housing within the chamber, spaced apart from the substrate, and positioned substantially below the substrate, wherein the first container and the second container are positioned within the interstitial container such that liquid held by the interstitial container contacts an interstitial portion of the lower surface of the substrate between the first and second portions of the lower surface of the substrate.

11. The substrate processing tool of claim 10, wherein the first isolation container and the second isolation container each comprise a central receptacle and a trench surrounding the central receptacle.

12. The substrate processing tool of claim 11, further comprising:
at least one liquid supply in fluid communication with the central receptacle of the first isolation container and the central receptacle of the second isolation container and configured to deliver the first and second liquids, respectively, thereto; and
a controller in operable communication with the at least one liquid supply, the first impeller, and the second impeller, the controller being configured to:
deliver the first liquid and the second liquid from the at least one liquid supply to the respective central receptacle of the first isolation container and the central receptacle of the second isolation container;
activate the first impeller and the second impeller, said activation causing the first impeller and the second impeller to respectively apply the force to the first liquid and the second liquid such that the impelled portions of the first liquid and the second liquid contact the lower surface of the substrate; and
after the activation of the first impeller and the second impeller, increase a volume of the first liquid delivered to the central receptacle of the first isolation container such that the first liquid in the central receptacle of the first isolation container merges with the impelled portion of the first liquid on the first portion of the lower surface of the substrate and increase a volume of the second liquid delivered to the central receptacle of the second isolation container such that the second liquid in the central receptacle of the second isolation container merges with the impelled portion of the second liquid on the second portion of the lower surface of the substrate.

* * * * *